United States Patent [19]
Matsuda et al.

[11] Patent Number: 5,335,457
[45] Date of Patent: Aug. 9, 1994

[54] METHOD OF CHUCKING SEMICONDUCTOR WAFERS

[75] Inventors: Akira Matsuda; Shigeki Shudo; Noboru Shimamoto, all of Annaka; Kohichi Tanaka, Takasaki; Hiromasa Hashimoto, Fukushima; Fumio Suzuki, Gunma, all of Japan

[73] Assignee: Shin-Etsu Handotai Co., Ltd., Tokyo, Japan

[21] Appl. No.: 966,484

[22] Filed: Oct. 26, 1992

[30] Foreign Application Priority Data

Oct. 28, 1991 [JP] Japan .................... 3-308417

[51] Int. Cl.$^5$ ............................................. B24B 7/22
[52] U.S. Cl. ............................................. 51/284 R; 51/235
[58] Field of Search ............ 51/235, 216 R, 216 LP, 51/217 L, 284 R; 269/21

[56] References Cited

U.S. PATENT DOCUMENTS

| | | | |
|---|---|---|---|
| 2,317,348 | 4/1943 | Wekeman | 51/235 |
| 2,877,607 | 3/1959 | Haracz | 51/235 |
| 3,004,766 | 10/1961 | Bryant | 51/235 |
| 3,131,476 | 5/1964 | Seher | 51/235 |
| 3,809,050 | 5/1974 | Chough et al. | 51/235 |
| 4,521,995 | 6/1985 | Sekiya | 51/235 |

FOREIGN PATENT DOCUMENTS

0239621 9/1990 Japan .................... 269/21

OTHER PUBLICATIONS

Patent Abstracts of Japan, vol. 11 No. 320 (E-550) (2767) Oct. 17, 1987.
Patent Abstracts of Japan, vol. 12, No. 190 (M-704) (3037) Jun. 3, 1988.

*Primary Examiner*—Jack Lavinder
*Attorney, Agent, or Firm*—Nikaido, Marmelstein, Murray & Oram

[57] ABSTRACT

A method of chucking semiconductor wafers, in which a silicone elastic layer with high flatness is formed on the surface of a hard substrate having fine through-holes for vacuum chucking. Next fine through-holes in the silicone elastic layer, are provided, each through-hole communicating with the fine through-holes of the hard substrate. Next a semi-conductor wafer is held on the hard substrate by vacuum chucking from the back side of the substrate, so as to hold the semiconductor wafer securely on the substrate only by surface adhesion of the silicone elastic layer during polishing of the wafer. This method does not require wax or similar adhesive for holding the semiconductor wafer on the hard surface during the polishing process, and can realize a high-precision and high-quality surface polishing process for the semiconductor wafers.

1 Claim, 2 Drawing Sheets

METHOD OF CHUCKING SEMICONDUCTOR WAFERS

BACKGROUND OF THE INVENTION

1. Field of the Invention

The present invention relates to a method of chucking a semiconductor wafer on a hard surface to polish one side of the wafer.

2. Description of the Prior Art

Conventionally, it is generally known that a semiconductor wafer is attached on a hard surface with appropriate tacky wax therebetween when the wafer is polished into a so-called mirror wafer. In such a method, however, it is difficult to obtain desirable mirror wafers because of nonuniformity in the thickness of the wax or similar reasons. Therefore, flatness precision on the semiconductor wafer per se must be limited. This method also requires washing after the polishing process to remove the wax from the back of the semiconductor wafer, so that the semiconductor wafers to be processed by this method are likely to be contaminated with the residual wax or damaged by handling during washing.

There have been heretofore proposed many methods which do not use such tacky wax. As one of such methods, there is known a method in which a special organic material such as polyurethane or similar like material is inserted between the semiconductor wafer and the hard surface as a cushion material (Japanese Patent Laid-Open Publication No.62-297064). In this method, however, it is difficult to desirably control the precisions in shape including flatness and parallelism after the polishing process to the wafer surface.

Also, there is known a method in which the semiconductor wafer is held on the hard surface by vacuum chucking through fine holes formed in the surface. However, in this method, since the semiconductor wafer directly contacts with the hard surface, the shape precisions including flatness and parallelism tend to be deteriorated by unevenness of the backside surface of the wafer, sandwiched fine particulate dust or the vacuum-chucking holes.

In an effort to alleviate such harmful effects as the unevenness of the back surface of the wafer or sandwiched particulate dust, there is disclosed a method of chucking the semiconductor wafer on a hard surface by surface adhesion of silicone rubber (Japanese Patent Laid-Open Publication No. 62-111442). In this method, however, the semiconductor wafer is chucked with conventional silicone rubber whose surface adhesion to the wafer is not sufficient. The semiconductor wafer tends to move in the planar direction thereof during the mirror polishing process. The polishing precision of the semiconductor wafer is undesirably dependent upon the flatness of the silicone rubber surface.

SUMMARY OF THE INVENTION

It is therefore an object of the present invention to provide a method of chucking semiconductor wafers, which makes i t possible to polish one side of a semiconductor wafer with high precision and high quality while holding the wafer securely on a hard surface without using wax or similar adhesive.

To achieve the above-mentioned object, the method of chucking semiconductor wafers according to the present invention comprises forming a silicone elastic layer with high flatness on a hard surface having fine holes for vacuum chucking, the silicone elastic layer being also provided with fine through-holes each communicating with the holes of the surface respectively, and holding a semiconductor wafer on the front surface of the hard substrate by vacuum chucking from the back side of the substrate, so as to hold the semiconductor wafer securely only by surface adhesion of the silicone elastic layer during the polishing process to the wafer.

The hard substrate used in the present invention consists of metals, ceramics or organic resins such as epoxy resins and similar materials, and has fine through-holes of 0.1 to 1.0 mm $\phi$ for vacuum chucking. These through-holes communicate with a vacuum source and a compressed-air supply source through a switch valve, respectively.

The silicone elastic material of this invention is mainly composed of straight-chain organopolysiloxanes which are represented by the following general formula:

$$R_a SiO_{(4-a)/2}$$

(where R denotes a methyl, a vinyl, a phenyl or a trifluoropropyl group, a is a positive numeral in the range of 1.98 to 2.02), and which may be oily or in a crude rubber state as far as the kinematic viscosity is 1000 (cs) or higher at 25° C. The silicone elastic material may also contain reinforcing silica materials, such as silica hydrogel and silica aerogel, heat-insulation-improving materials, such as titanium oxide and cerium oxide, and inorganic fillers, such as silica powder and diatomaceous earth.

As the curing agents of the silicone elastic material, there can be mentioned organic peroxides, such as di-t-butyl peroxide and 2,5-dimethyl-2,5-di(t-butyl peroxy)-hexane for radical reaction, organohydrodiene polysiloxanes having at least two hydrogen atoms coupling respectively with silicone atoms in each molecule and platinum catalysts for addition reaction, and multifunctional alkoxy silanes or siloxanes and salts of organometallic acids for condensation reaction. In particular, for simplification of the curing process, the curing agents for addition reaction may preferably be used.

For adhesiveness donation to the silicone elastic material, it is preferable to use organopolysiloxanes (adhesion-donative organopolysiloxanes) having $SiO_2$ units and $R'_3SiO_{0.5}$ units (where R' is a hydrogen atom or a methyl, a vinyl or a phenyl group, etc.) at a molar ratio of 1:0.4 to 1:1.5 in each molecule. When the molar ratio of $R'_3SiO_{0.5}$ units is lower than 0.4, storage stability is insufficient, while the surface adhesion does not appear when it exceeds 1.5.

The following is a typical example of addition-reaction-curing-type liquid silicone rubber compositions applicable to the present invention.

The composition comprises:

(A) 100 parts by weight of diorganopolysiloxane having viscosity of 1000 to 100000 (cp) at 25° C. and containing at least two alkenyl groups in each molecule;

(B) organohydrodiene polysiloxanes having at least two hydrogen atoms each coupling directly with silicone atoms in each molecule in such an amount as to regulate the molar ratio between the alkenyl groups of component (A) and the hydrogen atoms coupling with silicone atoms in the range of 0.4 to 4.0;

(C) 5 to 50 parts by weight of fine-powder silica having specific surface area larger than 50 m$^2$/g per 100 parts by weight of component (A); and (D) a catalytic amount of a platinum compound or platinum group compound.

For adhesiveness donation to the silicon composition, 10 to 100 parts by weight of the above-mentioned adhesion-donative organopolysiloxanes are added to 100 parts by weight of the composition. When the amount of the organopolysiloxanes is less than 10 parts by weight, the adhesion to be given to the composition is insufficient, while mechanical strength of the silicone rubber layer is reduced when the amount exceeds 100 parts by weight. The organopolysiloxanes may be added with a gate mixer or the like means since the composition is in a liquid state.

In order to enhance the adhesion between the silicone elastic material and the hard surface, a primer ordinarily used for silicone rubber may be coated on the hard surface. Otherwise, to generate self-adhesive effect in the silicone rubber, a suitable silane coupling agent may be mixed with the rubber composition in advance.

As the methods for providing the silicone elastic layer on the surface of the hard surface, there may be used a usual screen printing method or a coating method in which a spacer is disposed at an end portion of the hard substrate for controlling the coat layer.

In the coating method, the silicone rubber composition is dissolved into a predetermined concentration with an organic solvent, such as toluene, xylene, hexane and the like, and then coated on the hard substrate by spray coating or the like means. Thereafter, fine holes respectively communicating into the hard substrate are formed in the silicone coat layer. Subsequently, the coat layer is cured by hot air.

The rubber hardness of the cured silicone coat layer may preferably be in the range of 20° to 90°. When the hardness is less than 20°, the surface of the silicone elastic layer is polished with difficulties, thereby the flatness of the layer being deteriorated. On the other hand, the hardness in excess of 90° leads to insufficient surface adhesion.

Thereafter, the flatness of the surface of the silicone elastic layer is increased either by polishing with soft fine particles of silica on a hard surface having high flatness or by using a precision surface grinder. It is preferred that the adhesion obtained after the polishing process is 10 to 2000 g/cm$^2$. If the adhesion is lower than 10 g/cm$^2$, the semiconductor wafer tends to move in the planar direction during the polishing process to the surface of the wafer. On the other hand, if the adhesion is higher than 2000 g/cm$^2$, it becomes difficult to peel the semiconductor wafer away from the silicone layer after the polishing process.

The adhesion described above is indicated by adhesive strength (g/cm$^2$) which is force to be required for vertically pulling the semiconductor wafer which was adhered to the silicone elastic layer formed on the hard surface with a load of about 8 g/cm$^2$ and then left for a predetermined time period.

In the step of chucking the semiconductor wafer, the wafer is placed on the silicone elastic layer, and the vacuum suction is then carried out from the back side of the hard substrate. With the vacuum suction force, the semiconductor wafer is pinned to the silicone elastic layer.

Thereafter, even if the vacuum suction is not continued, the semiconductor wafer is held on the hard surface through the silicone elastic layer due to the surface adhesion of the layer. Since the semiconductor wafer is chucked by the surface adhesion of the silicone elastic layer as described above, adhesion of the wafer to the hard surface is so strong that the polishing process to the semiconductor wafer can be effected with ease.

After the polishing process, the semiconductor wafer alone can be removed from the hard surface by ejecting compressed air from the fine through-holes for vacuum suction. Even if fine particulate dust or unevenness in the surface of the semiconductor wafer exists, the effect thereof is almost absorbed due to viscoelasticity of the silicone elastic layer.

As described above, various inorganic fillers may be blended in the silicone elastic layer. In the event that a silicone layer containing such inorganic fillers is used, scratchs to be caused on the surface of the semiconductor wafer by the fillers can be avoided by disposing another silicone elastic layer containing no inorganic fillers on the filler-containing layer.

In addition, the present invention makes it possible to hold a semiconductor wafer securely only by the surface adhesion of the silicone elastic layer during the polishing process with almost no influence of the fine through-holes for vacuum chucking. The semiconductor wafer polished according to the present invention should be excel lent in the surface flatness and parallelism. Compared with the conventional method adopting wax or similar adhesive, the method according to the present invention can save time and trouble as well as enhance the precision and quality in the polishing process.

The above and other objects, features and advantages of the present invention will become manifest to those skilled in the art from a reading of the following disclosure and the appended claims.

DETAILED DESCRIPTION OF THE INVENTION

Examples of this invention will be described hereinafter.

EXAMPLE 1

To 100 parts by weight of addition-reaction-curing-type liquid silicone (Ke-1940-50A/B produced and sold by Shin-Etsu Chemical Industry Co., Ltd.), 20 parts by weight of adhesion-donative organopolysiloxane containing SiO$_2$ units and (CH$_3$)$_2$SiO$_{0.5}$ units at the molar ratio of 1:0.75 and vinyl groups at the content of 0.11 mol/100 g, and 0.8 parts by weight of polyoxyalkylene monobutylether as a thickening agent were added and mixed by a gate mixer.

Figure 1:
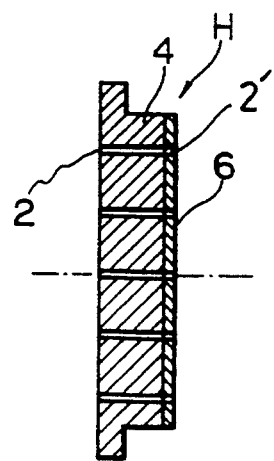
FIG. 1 is a cross section for explaining an embodiment of a jig for chucking a semiconductor wafer used in the method of the present invention.
Figure 2:
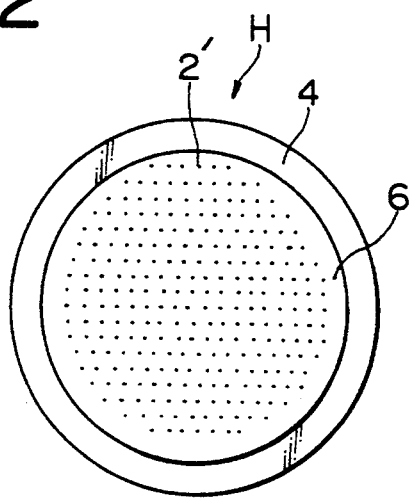
FIG. 2 is a plan view of FIG. 1.

A primer for silicone rubber was coated on the surface of a hard substrate 4 having through-holes 2 for vacuum chucking as shown in FIG. 1, and then dried by air for 30 minutes. Thereafter, the silicone composition prepared as described above was coated on the surface of the hard substrate by screen printing. Subsequently, through-holes 2' respectively communicating with the hard substrate 4 were formed in the silicone coat layer by sending compressed air to the silicone layer from the back side of the hard substrate. Then, the hard substrate was left in a hot-air drying chamber at 150° C. for 2 hours to cure the silicone coat layer. Thereafter, the flatness of the surface of the silicone elastic layer 6 was improved by a precision surface grinder (PSG-63DX produced and sold by OKAMOTO MACHINE TOOL WORKS, LTD.).

The jig H for chucking semiconductor wafers, obtained in the above manner, had flatness of 2.0 μm, surface roughness (Ra) of 0.8 μm and tack of 975 g/cm$^2$. The rubber hardness of the silicone elastic layer was 47°.

Figure 3:
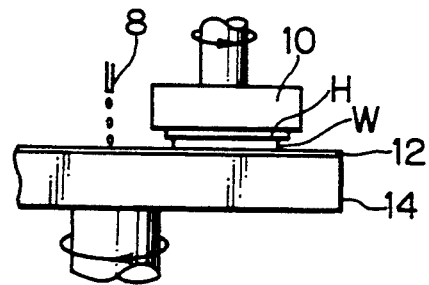
FIG. 3 is a diagramatical view for schematically showing a polishing machine used for carrying out the method of the present invention.

FIG. 3 shows a typical embodiment of polishing machines on which the jig H for chucking semiconductor wafers is mounted. In FIG. 3, reference numeral 8 designates polishing-liquid-supply source; 10, a portion for holding the hard substrate; 12, a polishing cloth; 14, a rotary disk; and W, a semiconductor wafer.

Figure 4:
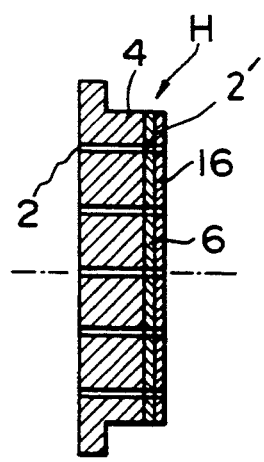
FIG. 4 is a cross-sectional view for explaining another embodiment of a jig for chucking a semiconductor wafer used in the method of the present invention.

According to the method of the present invention, it is possible to obtain semiconductor wafers of high precision and high quality by a reasonable and short-time process, Fig.4 shows an embodiment of a two-layer structure in which there was provided a first silicone elastic layer 6 containing inorganic fillers and a second protective silicone elastic layer 16 containing no inorganic fillers.

Comparative Example 1

To 100 parts by weight of addition-reaction-curing-type liquid silicone (KE-1940-20A/B produced and sold by Shin-Etsu Chemical Industry Co., Ltd. ), 0.8 parts by weight of polyoaxyalkylene monobutylether was added as a thickening agent, and then mixed by a gate mixer. Thereafter, a jig for chucking semiconductor wafers was prepared in the same manner as mentioned in Example 1. The jig had flatness of 10 μm, surface roughness (Ra) of 8.77 μm and adhesive strength of 9 g/cm$^2$. The rubber hardness of the silicone elastic layer was 20°.

The adhesion of the obtained jig is so low that a semiconductor wafer to be chucked by the jig tends to move in the planar direction when it is polished. In addition, it is impossible to produce high-precision semiconductor wafers due to the insufficient flatness in the surface of the silicone elastic layer.

As stated above, according to the present invention, it is possible to polish one side of a semiconductor wafer with high precision and high quality while chucking the wafer securely on a hard substrate without using wax or similar adhesive.

What is claimed is:

1. A method of chucking semiconductor wafers, comprising the steps of:

forming a silicone elastic layer with high flatness on a front surface of a hard substrate having fine through-holes for vacuum chucking, said silicone layer being also provided with fine through-holes, each communicating with said fine through-holes of said hard substrate wherein said silicone elastic layer has surface adhesion and contains an adhesion-donative agent, which is selected from organopolysiloxanes having $SiO_2$ units and $R'_3SiO_{0.5}$ units, where $R'$ is a hydrogen atom, a methyl, a vinyl or a phenyl group, having a molar ratio of 1 mol of $SiO_2$ to 0.4 to 1.5 mols of $R'_3SiO_{0.5}$ in each molecule;

holding a semiconductor wafer on said hard substrate through said silicone elastic layer by vacuum chucking from a back side of said substrate; and discontinuing said vacuum chucking while continuing to hold said semiconductor wafer securely on said substrate only by surface adhesion of said silicone elastic layer during a polishing process to said wafer.

* * * * *